United States Patent
Torii

(10) Patent No.: US 10,460,975 B2
(45) Date of Patent: Oct. 29, 2019

(54) VACUUM CHUCK, BEVELING/POLISHING DEVICE, AND SILICON WAFER BEVELING/POLISHING METHOD

(71) Applicant: SUMCO CORPORATION, Tokyo (JP)

(72) Inventor: Kantarou Torii, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 216 days.

(21) Appl. No.: 15/529,667

(22) PCT Filed: Oct. 5, 2015

(86) PCT No.: PCT/JP2015/078219
§ 371 (c)(1),
(2) Date: May 25, 2017

(87) PCT Pub. No.: WO2016/088444
PCT Pub. Date: Jun. 9, 2016

(65) Prior Publication Data
US 2017/0330783 A1    Nov. 16, 2017

(30) Foreign Application Priority Data
Dec. 4, 2014    (JP) .................................. 2014-245687

(51) Int. Cl.
*H01L 21/687*     (2006.01)
*H01L 21/02*      (2006.01)
(Continued)

(52) U.S. Cl.
CPC .............. *H01L 21/687* (2013.01); *B24B 9/00* (2013.01); *B24B 9/065* (2013.01); *B24B 37/02* (2013.01);
(Continued)

(58) Field of Classification Search
CPC ........... H01L 21/6838; H01L 21/67092; H01L 21/02024; H01L 21/02021; H01L 21/687; B24B 9/00; B24B 9/065; B24B 37/02; B24B 37/27; B24B 37/30; B24B 41/068
See application file for complete search history.

(56) References Cited

U.S. PATENT DOCUMENTS 8,284,395 B2    10/2012  Kamiyama et al.
2007/0139857 A1  6/2007  Watanabe et al.
(Continued)

FOREIGN PATENT DOCUMENTS

CN     203317214 U    12/2013
JP     2005-032959 A   2/2005
(Continued)

OTHER PUBLICATIONS

WIPO International Preliminary Report on Patentability in PCT/JP/2015/078219, dated Jun. 6, 2017.
(Continued)

*Primary Examiner* — Saul Rodriguez
*Assistant Examiner* — Ashley K Romano
(74) *Attorney, Agent, or Firm* — Greenblum & Bernstein, P.L.C.

(57) ABSTRACT

A vacuum chuck includes: a vacuum chuck stage having a circular vacuum surface; a vacuum protection pad provided to the vacuum surface; an annular or arc-shaped concave portion dividing the vacuum surface into a central region located closer to a center of the vacuum surface and an outer circumferential region located on an outer circumferential side; and radially-extending concave portions formed in the central region. The vacuum protection pad has through holes in communication with the radially-extending concave portions, and the vacuum protection pad is bonded to the vacuum surface at the central region excluding the radially-extending concave portions.

7 Claims, 14 Drawing Sheets

(51) Int. Cl.
  *H01L 21/683* (2006.01)
  *H01L 21/67* (2006.01)
  *B24B 9/00* (2006.01)
  *B24B 37/30* (2012.01)
  *B24B 37/02* (2012.01)
  *B24B 37/27* (2012.01)
  *B24B 41/06* (2012.01)
  *B24B 9/06* (2006.01)

(52) U.S. Cl.
  CPC ............. *B24B 37/27* (2013.01); *B24B 37/30* (2013.01); *B24B 41/068* (2013.01); *H01L 21/02021* (2013.01); *H01L 21/02024* (2013.01); *H01L 21/67092* (2013.01); *H01L 21/6838* (2013.01)

(56) References Cited

U.S. PATENT DOCUMENTS

2014/0076500 A1* 3/2014 Honda .............. H01L 21/67092
  156/750
2016/0111318 A1* 4/2016 Ichinose ............. H01L 21/6838
  430/322
2016/0237565 A1* 8/2016 Sieber ................ H01L 21/6838

FOREIGN PATENT DOCUMENTS

| | | |
|---|---|---|
| JP | 2005-311040 A | 11/2005 |
| JP | 2006-310697 A | 11/2006 |
| JP | 2007-142220 A | 6/2007 |
| JP | 2007-194612 A | 8/2007 |
| JP | 2008-62329 A | 3/2008 |
| TW | 200810882 A | 3/2008 |
| TW | 200923118 A | 7/2008 |

OTHER PUBLICATIONS

Office Action issued in Taiwanese family member Patent Appl. No. 104128290, dated Feb. 10, 2017, along with an English translation thereof.

Office Action issued in Korean family member Patent Appl. No. 10-2017-7014317, dated Jul. 11, 2018 , along with an English translation thereof.

* cited by examiner

VACUUM CHUCK, BEVELING/POLISHING DEVICE, AND SILICON WAFER BEVELING/POLISHING METHOD

TECHNICAL FIELD

The present invention relates to a vacuum chuck, a beveling/polishing device, and a beveling/polishing method of a silicon water.

BACKGROUND ART

A silicon wafer having a large diameter is prevailingly subjected to a double-sided polishing of polishing a front surface and a rear surface to provide polished surfaces. Accordingly, not only the front surface but also the rear surface are increasingly demanded for a high quality in terms of dirt, scratch and the like.

Moreover, a beveled portion of the silicon wafer is also increasingly demanded for a high quality of a mirror surface. Thus, it is essential that the beveled portion is subjected to beveling/polishing. In a general beveling/polishing, a silicon wafer W is placed on a vacuum chuck 2 of a beveling/polishing device 1 as shown in FIG. 1. The silicon wafer W is held by a vacuum to be sucked and held on the vacuum chuck 2. While the vacuum chuck 2 holds the silicon wafer W, the silicon wafer W is rotated at a high speed and a polishing slurry is supplied, where a polishing unit 3 provided with a polishing pad is pressed onto the beveled portion to polish the beveled portion.

In the beveling/polishing, defects (e.g., contact mark) are adversely generated on a sucked surface of the silicon wafer W since the vacuum chuck 2 sucks and holds the silicon wafer W.

In order to solve such a problem, as shown in FIG. 2, there has been technically known the vacuum chuck 2 including: a vacuum chuck stage 2B having a vacuum surface and a concave portion 2A for holding the silicon wafer on the vacuum surface W by a vacuum; and a vacuum protection pad 2C shaped in conformity with a pattern of the concave portion 2A and attached to the vacuum chuck stage 2B. In the vacuum chuck 2 with the above arrangement, the silicon wafer W is sucked and held on the flexible vacuum protection pad 2C, thereby reducing damage on a held surface of the silicon wafer W.

As a technique of the vacuum chuck, a vacuum chuck including a flexible outer flange that defines an outer circumferential part of the vacuum surface is disclosed (see Patent Literature 1). In the vacuum chuck of Patent Literature 1, even when an external processing force is applied on an outer circumference of the wafer sucked on the vacuum surface to flex the wafer, the outer circumferential part of the vacuum surface, which is defined by the outer flange, follows the flexed wafer to prevent formation of a gap between the wafer and the vacuum surface and eventually breakage of a vacuum, so that the wafer is stably retainable.

CITATION LIST

Patent Literature(s)

Patent Literature 1: JP-A-2005-311040

SUMMARY OF THE INVENTION

Problem(s) to be Solved by the Invention

In the vacuum chuck of Patent Literature 1, a vacuum pad has an opening formed at a position corresponding to the flexible outer flange. Accordingly, when the wafer is flexed by the external force during the beveling/polishing, the outer flange cannot sufficiently follow the wafer, so that the vacuum pad on the outer flange is separated from the wafer at the interface therebetween, which may break a vacuum from the opening at the position corresponding to the outer flange.

Moreover, in the beveling/polishing, a contact between the silicon wafer and the vacuum chuck in presence of the polishing slurry generates defects in an outer circumferential region of the silicon water.

FIG. 3 shows a map of LPD (Light Point Defect) generated on a sucked surface of the silicon wafer. In FIG. 3, positions indicated by a diamond shape show the LPD.

Specifically, as shown in FIG. 3, a defect pattern is formed on the sucked surface of the silicon wafer W after the beveling and polishing, mainly along the outer circumference of the vacuum chuck stage. The defect pattern causes degradation of particle quality and degradation of nano-topology quality.

An object of the invention is to provide a vacuum chuck, a beveling/polishing device, and a beveling/polishing method of a silicon wafer, which are capable of improving a tight contact with the silicon wafer and inhibiting generation of defects in an outer circumferential region of the silicon wafer.

Means for Solving the Problem(s)

A generation mechanism of defects formed in the outer circumferential region of the silicon wafer in the above beveling/polishing is inferred as follows.

The beveling/polishing of the silicon wafer is conducted as shown in FIG. 1. While being sucked and held on the vacuum chuck 2 of the beveling/polishing device 1, the silicon wafer W is rotated at a high speed and a polishing slurry is supplied, where a polishing unit 3 provided with a polishing pad is further pressed with a predetermined load onto a to-be-beveled portion of the silicon wafer W to bevel and polish the beveled portion.

As shown in FIG. 4, the polishing unit 3 includes: an upper base 31, an end base 32, and a lower base 33 according to positions for polishing the beveled portion. A polishing pad 34 is attached to each of the upper base 31, the end base 32, and the lower base 33. In the beveling/polishing device 1, the upper base 31, the end base 32, and the lower base 33 are appropriately arranged along the entire circumference of the silicon wafer W. Accordingly, when the beveling/polishing device 1 is seen from the above and, for instance, the upper base 31, the upper base 31, the end base 32, and the lower base 33 are sequentially clockwise disposed, the silicon wafer W anticlockwise rotated at a high speed is sequentially polished by the lower base 33, the end base 32, and the upper base 31. Since the silicon wafer W sequentially receives loads from different directions during the beveling/polishing, the outer circumferential region of the silicon wafer W vibrates at a high frequency (hereinafter, also occasionally referred to as "wafer vibration").

As shown in FIG. 5, in the wafer vibration, when the silicon wafer W receives a load F1 from the lower side by the polishing using the polishing pad of the lower base, the outer circumferential region of the silicon wafer W is flexed upward. When the silicon wafer W is flexed, an interface between the vacuum protection pad 2C and the silicon wafer W in the outer circumferential region is sometimes temporarily separated. The silicon wafer W is held by a vacuum to be sucked and held on the vacuum chuck 2. Accordingly, this holding the wafer by means of a vacuum (hereinafter, occasionally refers to "vacuum holding") causes the polishing slurry S to be sucked from a gap generated by the separated interface, so that the polishing slurry S enters between the vacuum protection pad 2C and the silicon wafer W.

Subsequently, when the silicon wafer W receives a load F2 from the upper side by the polishing using the polishing pad of the upper base, the outer circumferential region of the silicon wafer W is flexed downward. When the silicon wafer W is flexed, the temporarily-separated outer circumferential region of the silicon wafer W is pressed onto the vacuum protection pad 2C. At this time, since the polishing slurry S entering the gap between the silicon wafer W and the vacuum protection pad 2C is present on the vacuum protection pad 2C, the outer circumferential region of the silicon wafer W hits and collides with abrasive grains contained in the polishing slurry S. Since the silicon wafer W is flexed while the abrasive grains are present in the interface between the silicon wafer W and the vacuum protection pad 2C, a part of the silicon wafer W in contact with the abrasive grains is worn.

Thus, in the wafer vibration in presence of the polishing slurry S, when a mechanical action occurs with the intervening polishing slurry S in the outer circumferential region of the silicon wafer W held by the vacuum protection pad 2C, it is inferred that an etching action locally progresses to generate a scratched dent W1 in the outer circumferential region of the silicon wafer W, mainly along the outer circumference of the vacuum chuck stage 2B.

As a result of dedicated study, the inventors has found that formation of defects in the outer circumferential region of the silicon wafer in the beveling/polishing can be inhibited by improving followability of the outer circumferential region of the vacuum chuck to the silicon wafer, and simultaneously by securing a tight contact between the vacuum protection pad and the silicon wafer in the outer circumferential region to inhibit the polishing slurry from entering.

The invention has been reached based on the above findings.

According to an aspect of the invention, a vacuum chuck includes: a vacuum chuck stage including a circular vacuum surface; a vacuum protection pad provided to the vacuum surface; an annular or arc-shaped concave portion dividing the vacuum surface into a central region located closer to a center of the vacuum surface and an outer circumferential region located on an outer circumferential side; and radially-extending concave portions formed in the central region, in which the vacuum protection pad has through holes in communication with the radially-extending concave portions, and the vacuum protection pad is bonded to the vacuum surface at the central region excluding the radially-extending concave portions.

According to the above aspect of the invention, the vacuum protection pad is bonded to the vacuum surface of the vacuum chuck stage at the central region which is divided by the annular or arc-shaped concave portion. In other words, an outer part of the vacuum protection pad provided to the vacuum surface of the vacuum chuck stage with respect to the central region is not bonded to the vacuum surface.

Accordingly, even when the outer circumferential region of the silicon wafer is flexed upward or downward due to the wafer vibration generated during the beveling and polishing, the outer circumferential region of the vacuum protection pad which is not bonded to the vacuum surface follows the silicon wafer to be flexed. Particularly, since only the vacuum protection pad that is more flexible than the vacuum chuck stage is attached to the silicon wafer by a surface tension and follows the silicon wafer to be flexed, the interface between the vacuum protection pad and the silicon wafer in the outer circumferential region is constantly kept in a highly tight contact even at occurrence of the wafer vibration.

As a result, the outer circumferential region of the silicon wafer is inhibited from being temporarily separated from the vacuum protection pad due to the wafer vibration. Consequently, during the wafer vibration, the polishing slurry can be inhibited from entering the interface between the silicon wafer and the vacuum protection pad.

When the silicon wafer is flexed due to the wafer vibration, a gap is generated in the outer circumferential region where the vacuum protection pad is not bonded to the vacuum chuck stage. The vacuum holding causes the polishing slurry to be sucked through the gap generated between the vacuum chuck stage and the vacuum protection pad. Since the silicon wafer is protected by the vacuum protection pad along a passage through which the polishing slurry is sucked, a contact between the sucked surface of the silicon wafer and the polishing slurry is reduced.

Moreover, since the gap generated between the vacuum chuck stage and the vacuum protection pad defines the passage through which the polishing slurry is sucked, a frequency of the polishing slurry to be sucked into the interface between the silicon wafer and the vacuum protection pad is reduced. As a result, since the passage through which the polishing slurry is sucked is dispersed, a sucked amount of the polishing slurry entering the interface between the silicon water and the vacuum protection pad is reduced.

Moreover, the vacuum protection pad has through holes in communication with the radially-extending concave portions. Since the through holes are provided at positions in communication with the radially-extending concave portions, a sucking-and-holding force generated by the vacuum holding is directly transmitted to the sucked surface of the silicon wafer through the radially-extending concave portions and the through holes. Accordingly, the silicon wafer is stably sucked and held on the vacuum surface through the vacuum protection pad.

When the through holes are provided in communication with the annular or arc-shaped concave portion on the outer circumference in addition to those at the positions in communication with the radially-extending concave portions, at the outermost circumferential region of the vacuum chuck stage, the vacuum holding is disturbed in two systems of one passing through the interface between the silicon wafer and the vacuum protection pad and the other one passing through the interface between the vacuum protection pad and the vacuum chuck stage. Accordingly, the tight contact at the interface between the silicon wafer and the vacuum protection pad is reduced to deteriorate the followability of the vacuum protection pad due to the wafer vibration. Consequently, a mechanical action may be increasingly locally applied to the outer circumferential region of the silicon wafer by the wafer vibration to further promote defect formation.

Thus, according to the vacuum chuck in the above aspect of the invention, while the silicon wafer is kept being sucked and held, the beveling/polishing of the silicon wafer can be conducted with a desired accuracy and the polishing slurry is inhibited from entering the interface between the sucked surface of the silicon wafer and the vacuum protection pad.

Consequently, generation of defects in the outer circumferential region of the silicon wafer can be inhibited.

In the above arrangement, the vacuum protection pad is preferably shaped in a circle having a diameter equal to or more than a diameter of the vacuum surface.

In the above arrangement, the vacuum protection pad is formed in a circle having a diameter equal to or more than a diameter of the vacuum surface. By thus providing the shape of the vacuum protection pad similar to the shape of the silicon water (i.e., an object to be processed), a region of the silicon wafer to be protected by the vacuum protection pad can be increased. Consequently, a risk of degrading the quality of the silicon water during the beveling/polishing can be further reduced.

According to another aspect of the invention, a beveling-and-polishing device includes the vacuum chuck with the above arrangement.

The beveling/polishing device according to the above aspect of the invention includes the above-described vacuum chuck. Accordingly, such a beveling/polishing device capable of suitably polishing the beveled portion of the silicon wafer in the same condition as the above-mentioned vacuum chuck according to the above aspect of the invention works can be provided.

According to a still another aspect of the invention, in a method of beveling and polishing a silicon wafer using a vacuum chuck including: a vacuum chuck stage having a circular vacuum surface; and a vacuum protection pad provided to the vacuum surface, the method includes: sucking and holding the silicon wafer with the vacuum protection pad; and polishing a beveled portion of the silicon wafer, the vacuum chuck further including: an annular or arc-shaped concave portion dividing the vacuum surface into a central region located closer to a center of the vacuum surface and an outer circumferential region located on an outer circumferential side; and radially-extending concave portions formed in the central region, in which the vacuum protection pad has through holes in communication with the radially-extending concave portions, and the vacuum protection pad is bonded to the vacuum surface at the central region excluding the radially-extending concave portions.

The beveling/polishing method of the silicon wafer according to the above aspect of the invention includes beveling and polishing using the above-described vacuum chuck according to the above aspect of the invention. Accordingly, the beveled portion of the silicon wafer can be suitably polished in the same condition as the above-mentioned vacuum chuck according to the above aspect of the invention works.

In the above arrangement, the vacuum protection pad is preferably shaped in a circle having a diameter equal to or more than a diameter of the vacuum surface.

In the above arrangement, the vacuum protection pad is formed in a circle having a diameter equal to or more than a diameter of the vacuum surface. By thus providing the shape of the vacuum protection pad similar to the shape of the silicon wafer (i.e., an object to be processed), a region of the silicon wafer to be protected by the vacuum protection pad can be increased. Consequently, a risk of degrading the quality of the silicon wafer during the beveling/polishing can be further reduced.

BRIEF DESCRIPTION OF DRAWING(S)

DESCRIPTION OF EMBODIMENT(S)

An exemplary embodiment(s) of the invention will be described below with reference to the attached drawings.
Structure of Beveling/Polishing Device A beveling/polishing device usable for beveling and polishing in the exemplary embodiment will be described.

Figure 1:
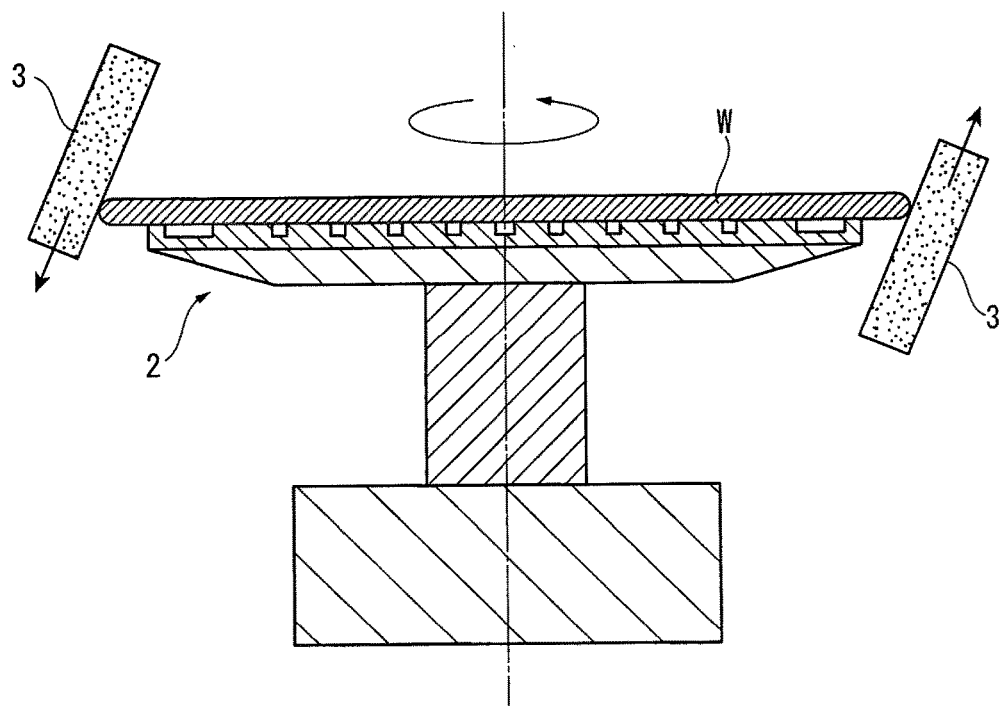
FIG. 1 is an illustration showing beveling and polishing of a silicon wafer using a beveling/polishing device.
Figure 2:
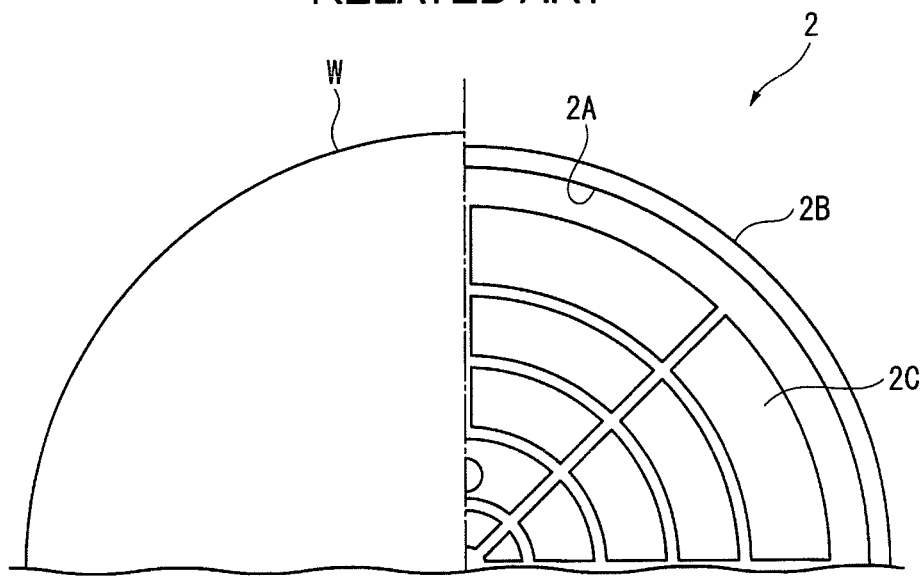
FIG. 2 is an illustration showing a vacuum protection pad attached on a vacuum surface of a vacuum chuck stage.
Figure 3:
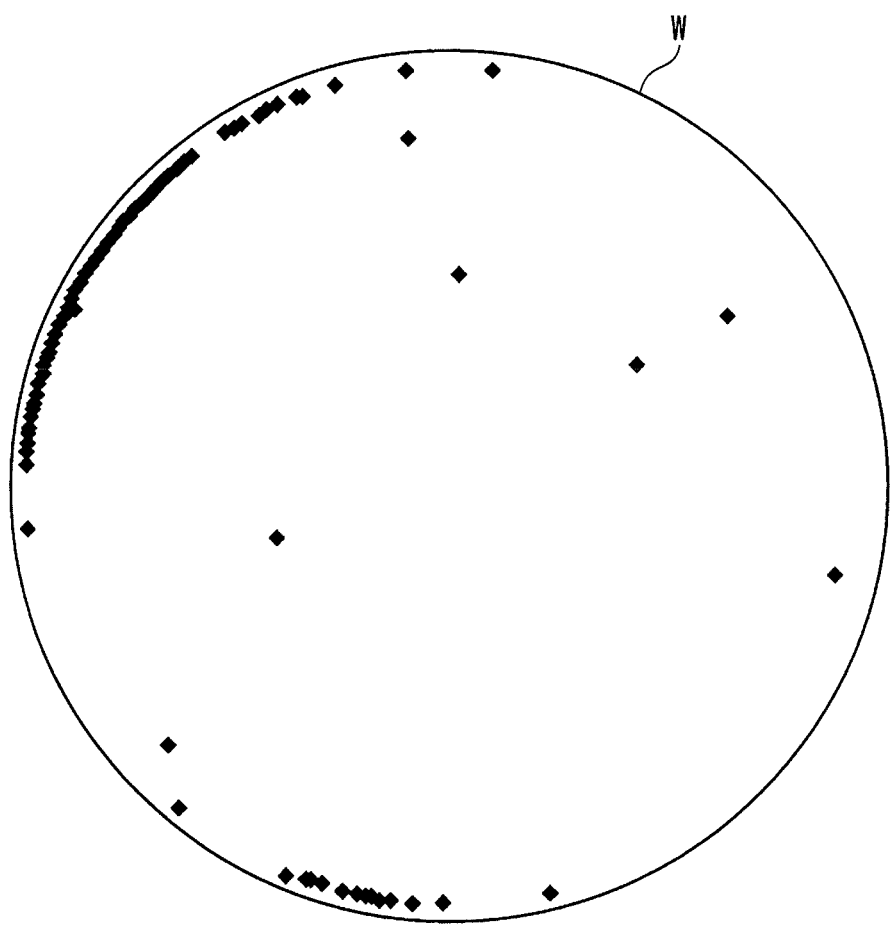
FIG. 3 shows a map of LPD generated on a sucked surface of the silicon wafer after the beveling and polishing.
Figure 4:
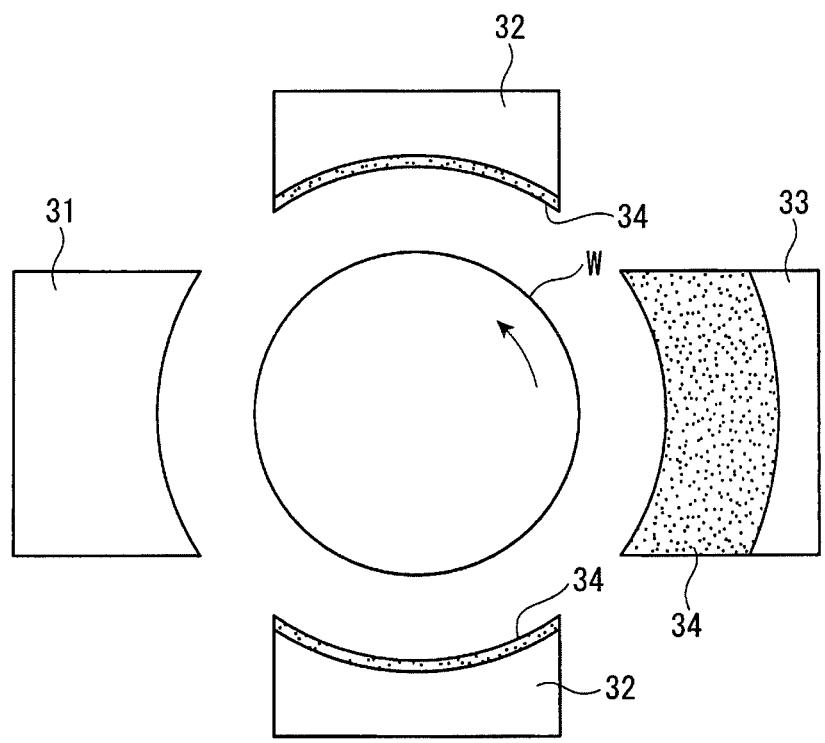
FIG. 4 is a top plan showing arrangement positions of a polishing pad of the beveling/polishing device shown in FIG. 1.
Figure 6:
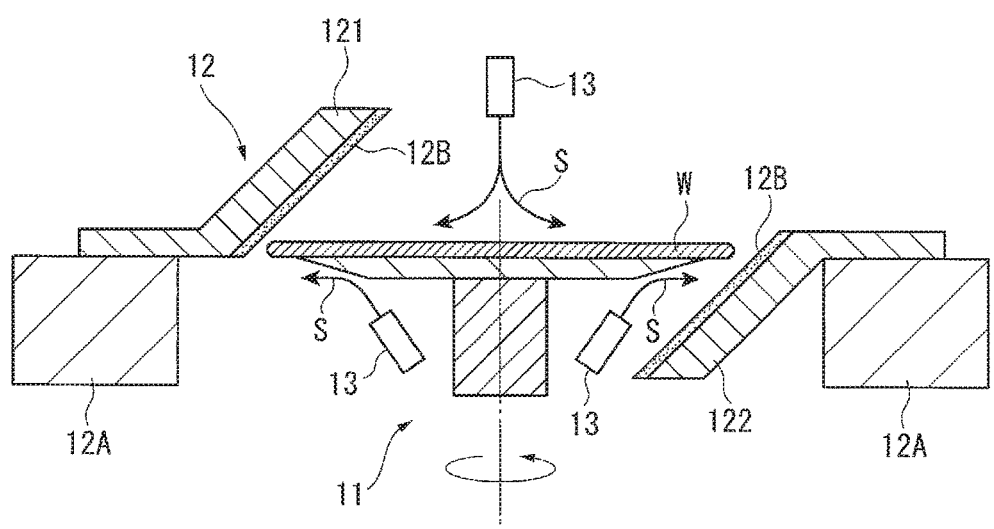
FIG. 6 is an illustration schematically showing a beveling/polishing device in an exemplary embodiment of the invention.
Figure 5:
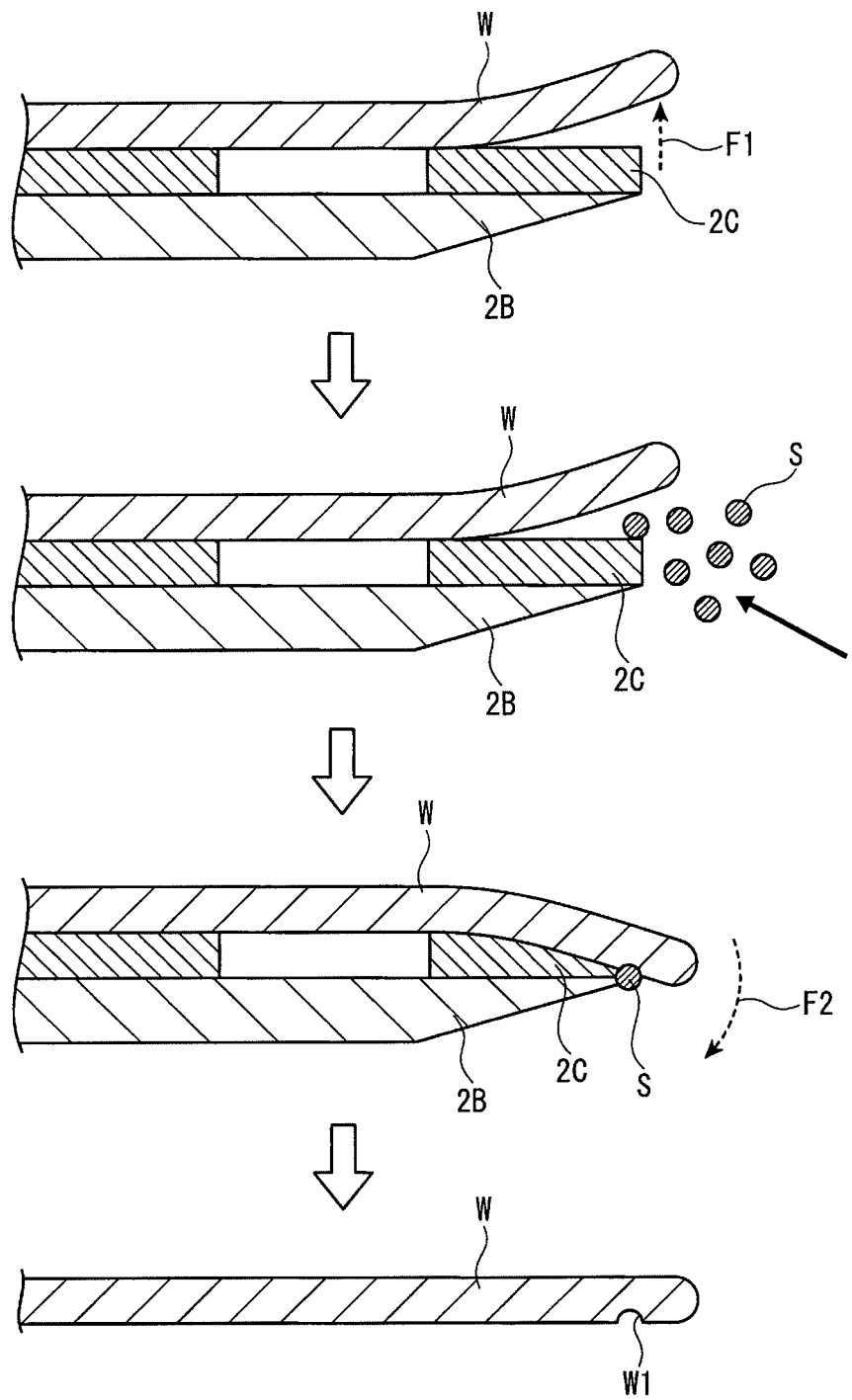
FIG. 5 is an illustration for explaining a generation mechanism of defects formed in an outer circumferential region of the silicon wafer.
Figure 7:
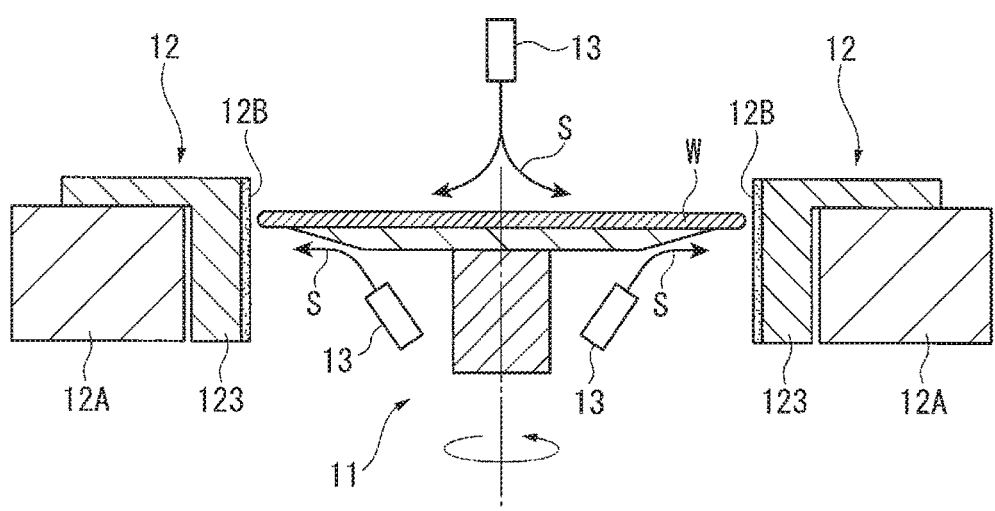
FIG. 7 is another illustration schematically showing the beveling/polishing device in the exemplary embodiment.

As shown in FIG. 6, a beveling/polishing device 10 includes: a vacuum chuck 11 configured to suck a lower surface of a silicon wafer W; a polishing unit 12 configured to mirror-polish a beveled portion of the silicon wafer W sucked by the vacuum chuck 11; and a pipe 13 configured to supply a polishing slurry S.
Polishing Unit The polishing unit 12 includes: a polishing member 12A configured to mirror-polish the beveled portion of the silicon wafer W; and a driving unit (not shown) configured to raise and lower the polishing member 12A in a top-bottom direction and press the polishing member 12A onto the silicon wafer W. As shown in FIGS. 6 and 7, an upper base 121, a lower base 122 and an end base 123 are connected to the polishing member 12A. A polishing pad 12B is attached to each of the upper base 121, the lower base 122 and the end base 123.

For a descriptive purpose, a base positioned on a left side of FIG. 6 is defined as the upper base 121 and a base positioned on a right side of FIG. 6 is defined as the lower base 122. In FIG. 7, respective bases on left and right sides are defined as the end base 123.

Figure 8:
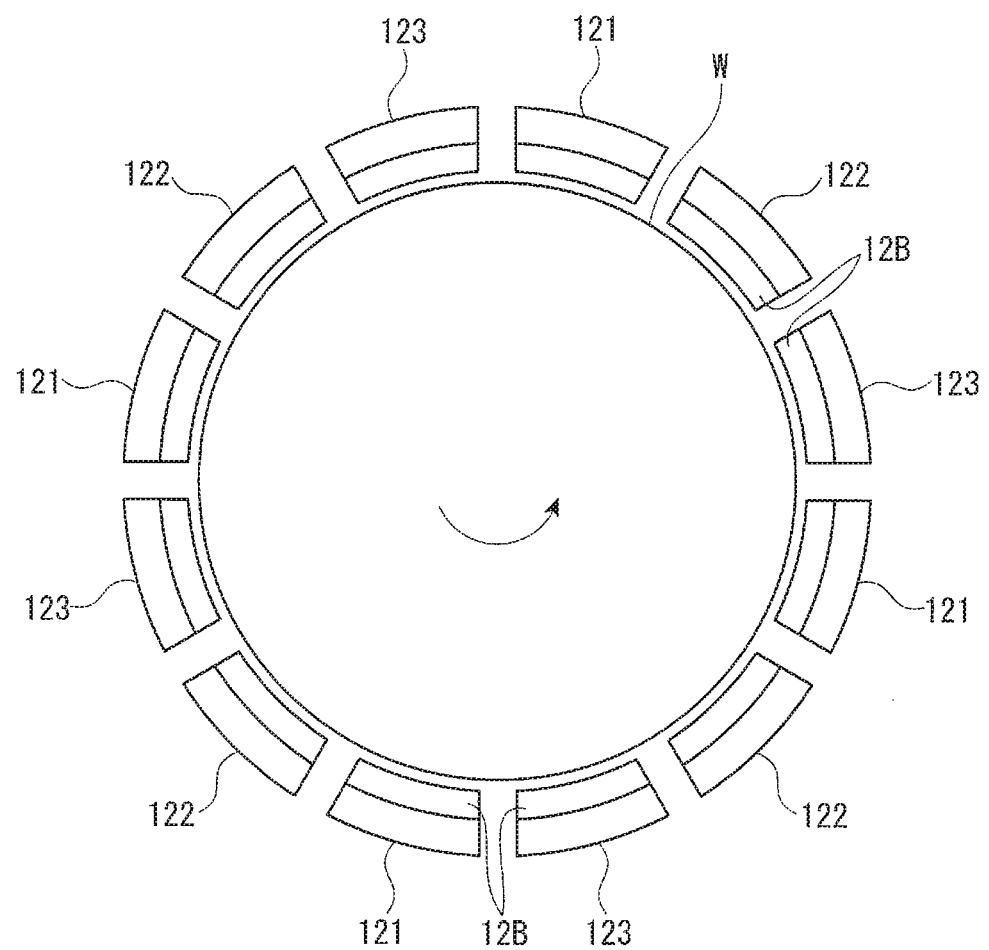
FIG. 8 is top plan showing arrangement positions of the polishing pad.

As shown in FIG. 8, the upper base 121, the lower base 122 and the end base 123 are arc-shaped in the same length and disposed around the silicon wafer W at a predetermined distance therebetween.

In the exemplary embodiment, when the beveling/polishing device 10 is seen from the above, the upper base 121, the lower base 122 and the end base 123 are sequentially clockwise disposed. It should be noted that the shape, the number, the sequence and the like of the upper base 121, the lower base 122 and the end base 123 are appropriately adjustable.

The polishing pad 12B is preferably an unwoven fabric. The unwoven fabric is particularly preferably an unwoven fabric having an ASKER C hardness within a range from 55 to 56.

Polishing Slurry

A polishing slurry S to be supplied from the pipe 13 is preferably an alkali aqueous solution containing abrasive grains. It is particularly preferable to use a KOH aqueous solution having pH of 10 to 11 as the alkali aqueous solution and use colloidal silica having a 50-nm mean particle size as the abrasive grains.

Vacuum Chuck

Figure 9A:
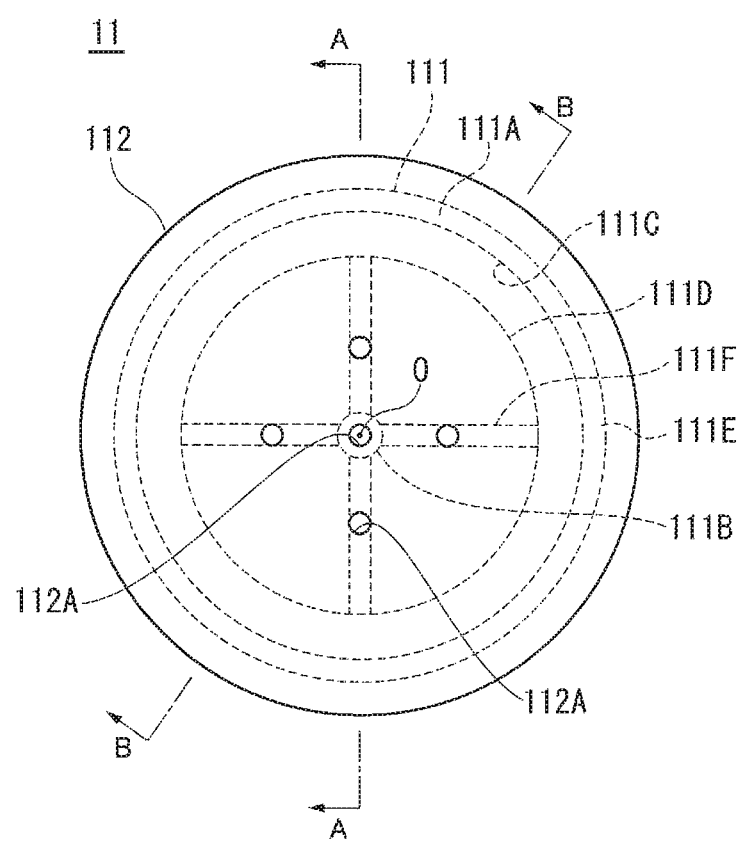
FIG. 9A is a schematic top plan showing a vacuum chuck in the exemplary embodiment.
Figure 9B:
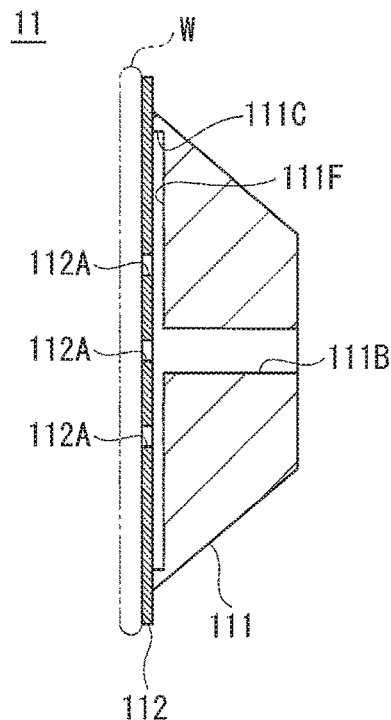
FIG. 9B is an illustration schematically showing the vacuum chuck in the exemplary embodiment, the illustration being a cross section taken along an A-A line of FIG. 9A.
Figure 9C:
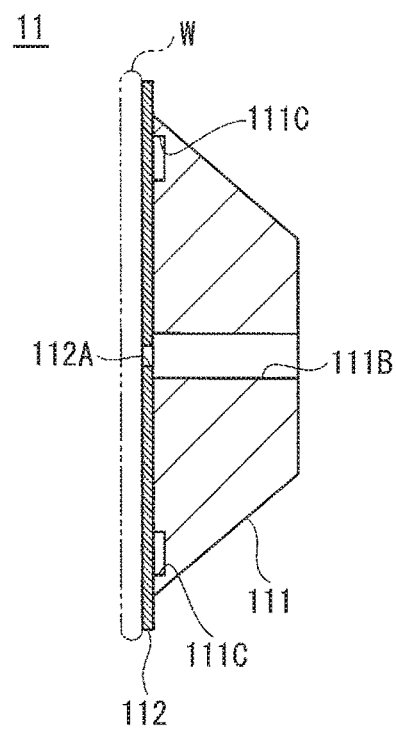
FIG. 9C is an illustration schematically showing the vacuum chuck in the exemplary embodiment, the illustration being a cross section taken along a B-B line of FIG. 9A.

FIG. 9 is an illustration schematically showing a vacuum chuck in the exemplary embodiment, specifically, in which FIG. 9A is a top plan, FIG. 9B is a cross section taken along an A-A line of FIG. 9A, and FIG. 9C is a cross section taken along a B-B line of FIG. 9A.

As shown in FIG. 9A, the vacuum chuck 11 includes a vacuum chuck stage 111 and a vacuum protection pad 112. The vacuum chuck stage 111 includes a circular vacuum surface 111A as an upper surface. The vacuum protection pad 112 is bonded to the vacuum surface 111A. Moreover, the vacuum chuck 11 includes a rotary unit (not shown) configured to rotate the vacuum chuck stage 111.

Vacuum Chuck Stage

As shown in FIGS. 9B and 9C, the vacuum chuck stage 111 is a form of a block in a truncated cone. The vacuum surface 111A defined at the upper surface of the vacuum chuck stage 111 is preferably formed in a circle smaller than the silicon wafer W so that the vacuum surface 111A does not interfere with the polishing unit 12 when the polishing unit 12 polishes the beveled portion of the silicon wafer W. A communication hole 111B connected to a vacuum source (not shown) is formed at a center O of the vacuum surface 111A in a manner to penetrate the vacuum chuck stage 111 from an upper side to a lower side.

The vacuum surface 111A includes an annular concave portion 111C formed along an imaginary circle around the center O of the vacuum surface 111A. The annular concave portion 111C divides the vacuum surface 111A into a central region 111D located closer to the center and an outer circumferential region 111E located on an outer circumferential side. Radially-extending concave portions 111F are formed in the central region 111D. The radially-extending concave portions 111F extends radially from the center O of the vacuum surface 111A. In each of the radially-extending concave portions 111F, a first end thereof near the center O is in communication with a communication hole 111B and a second end thereof is in communication with the annular concave portion 111C. Accordingly, by connecting the communication hole 111B to the vacuum source, the communication hole 111B, the radially-extending concave portion 111F, and the annular concave portion 111C are vacuumized.

The radially-extending concave portions 111F are preferably provided in a point symmetry with respect to the center O. Although FIG. 9A shows an arrangement of four radially-extending concave portions 111F, five or more radially-extending concave portions 111E may be formed. The arrangement of the radially-extending concave portions 111F is preferably three or more radially-extending concave portions 111E capable of being provided in a point symmetry with respect to the center O and configured to evenly sucking and holding the silicon wafer W.

Vacuum Protection Pad

The vacuum protection pad 112 is provided in order to prevent generation of defects (e.g., contact mark) on the sucked surface of the silicon wafer W. For this reason, the vacuum protection pad 112 preferably has characteristics of compressibility and flexibility. The vacuum protection pad 112 is exemplified by polyurethane resin exhibiting high compressibility and flexibility. When a resin to be used has a low air-tightness, a sheet having air-tightness is preferably laminated on the resin in order to improve the air-tightness of the vacuum protection pad.

The vacuum protection pad 112 has through holes 112A. The through holes 112A are provided at a position in communication with the communication hole 111E and at positions in communication with the radially-extending concave portions 111F when the vacuum protection pad 112 is bonded to the vacuum surface 111A of the vacuum chuck stage 111. In other words, the through holes 112A are provided in the central region 111D of the vacuum surface 111A and not provided in the outer circumferential region 111E. Since the through holes 112A are provided at the above positions, the silicon wafer W is held by a vacuum to be stably sucked and held on the vacuum surface 111A through the vacuum protection pad 112.

Moreover, the through holes 112A are preferably respectively in communication with a plurality of radially-extending concave portions 111F formed on the vacuum surface 111A. Accordingly, the number of the through holes 112A is preferably at least equal to or more than the number of the concave portions 111F. Moreover, in order to evenly suck and hold the silicon wafer W along the entire circumference, the through holes 112A formed in a plurality are preferably provided in a point symmetry with respect to the center O. Further, with respect to one of the radially-extending concave portions 111F, a single through hole 112A may be formed or two or more through holes 112A may be formed.

The vacuum protection pad 112 is preferably formed in a circle having a diameter equal to or more than a diameter of the vacuum surface 111A of the vacuum chuck stage 111. However, when the vacuum protection pad 112 is excessively large, the vacuum protection pad 112 interferes with the polishing unit 12 when beveling and polishing the silicon wafer W, thereby deteriorating polishing performance. Accordingly, the vacuum protection pad 112 preferably has a size enough not to interfere with the polishing unit 12 when the polishing unit 12 polishes the beveled portion of the silicon wafer W.

The vacuum protection pad 112 is bonded to the vacuum surface 111A at the central region 111D excluding the radially-extending concave portion 111F. For instance, bonding between the vacuum surface 111A and the vacuum protection pad 112 is preferably conducted with a double-sided adhesive tape. It should be noted that the double-sided adhesive tape may be replaced by an appropriate adhesive or glue.

Beveling Polishing of Silicon Wafer Using Beveling/Polishing Device

Next, a beveling and polishing method using the beveling/polishing device 10 provided with the above vacuum chuck 11 will be described.

Firstly, the silicon wafer W is placed on the vacuum protection pad 112 of the vacuum chuck 11. Subsequently, the communication hole 111B is connected to a vacuum source to be vacuumized, so that the vacuum chuck 11 sucks and holds the silicon water W.

Next, the upper base 121, the lower base 122 and the end base 123 connected to the polishing member 12A are pressed at a predetermined pressure onto respective corresponding positions of the beveled portion and kept in a pressed condition.

Subsequently, while supplying a polishing slurry from the pipe 13, the silicon wafer W is rotated by rotating the rotary unit.

With this operation, an upper part of the beveled portion of the silicon wafer W is pressed onto the upper base 121, a lower part of the beveled portion is pressed onto the lower base 122, and a central part of the beveled portion is pressed onto the end base 123. Consequently, each of the above parts of the beveled portion of the silicon wafer W is polished with the polishing pad 12B attached to each of the upper base 121, the lower base 122 and the end base 123. The driving unit moves the upper base 121 and the lower base 122 diagonally along the tapered beveled portion of the silicon wafer W and moves the end base 123 in the top-bottom direction, thereby suitably polishing the parts of the beveled portion of the silicon wafer W.

Figure 10:
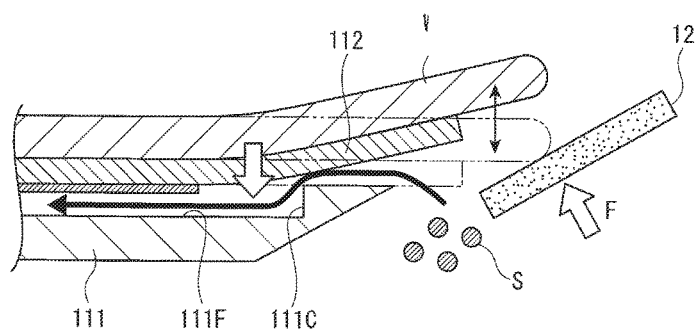
FIG. 10 is an illustration for explaining a state of the silicon wafer and a flow of a polishing slurry when beveling and polishing the silicon wafer using the vacuum chuck in the exemplary embodiment.
Figure 11:
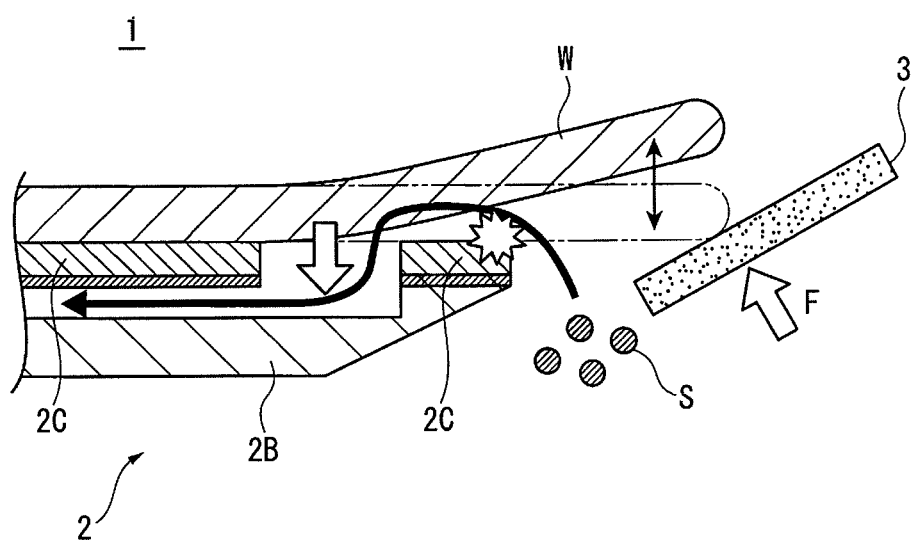
FIG. 11 is an illustration for explaining a state of the silicon wafer and a flow of a polishing slurry when beveling and polishing the silicon wafer using a typical vacuum chuck.

FIG. 10 is an illustration for explaining a state of the silicon wafer and a flow of the polishing slurry when beveling and polishing the silicon wafer using the vacuum chuck in the exemplary embodiment.

As shown in FIG. 10, when wafer vibration is caused by beveling and polishing, the outer circumferential region of the silicon wafer W is flexed upward or downward. In the vacuum chuck 11 according to the exemplary embodiment, since the outer circumferential region of the vacuum protection pad 112 is not bonded to the vacuum chuck stage 111, the vacuum protection pad 112 follows the flexed silicon wafer W to be flexed. Accordingly, even when a load F is applied by the polishing unit 12 onto an interface between the vacuum protection pad 112 and the silicon water W in the outer circumferential region, the interface is not separated and kept in a highly tight contact.

Since the outer circumferential region of the vacuum protection pad 112 follows the flexed silicon wafer W to be flexed, a gap is generated between the outer circumferential region of the vacuum protection pad 112 and the outer circumferential region of the vacuum chuck stage 111 which are not bonded to each other. The vacuum holding causes the polishing slurry to be sucked through the gap generated between the vacuum chuck stage 111 and the vacuum protection pad 112. The polishing slurry sucked through the gap passes through the annular concave portion 111C, the radially-extending concave portions 111F, and the communication hole 111E to reach the vacuum source and is collected by a polishing slurry collection unit (not shown).

On the contrary, when the vacuum protection pad 2C is also bonded to the vacuum chuck stage 111 at the outer circumferential region of the vacuum surface in addition to the central region thereof, the generated wafer vibration separates the interface between the silicon wafer W and the vacuum protection pad 2C, so that the polishing slurry S may enter the gap therebetween to form defects in the outer circumferential region of the silicon wafer W.

Advantage(s) of Embodiment(s)

The above exemplary embodiment provides the following advantages.

(1) The vacuum protection pad 112 is bonded to the central region 111D of the vacuum surface 111A of the vacuum chuck stage 111 which is divided by the annular concave portion 111C.

Even when the outer circumferential region of the silicon wafer W is flexed upward or downward due to the wafer vibration generated during the beveling and polishing, the outer circumferential region of the vacuum protection pad 112, which is not bonded to the vacuum surface 111A, follows the silicon wafer W to be flexed. Accordingly, the interface between the vacuum protection pad 112 and the silicon water W in the outer circumferential region is kept in a highly tight contact. Consequently, during the wafer vibration, the polishing slurry S can be inhibited from entering the interface between the silicon water W and the vacuum protection pad 112.

(2) The vacuum protection pad 112 has the through holes 112A in communication with the radially-extending concave portions 111F.

Since the through holes 112A are positioned in communication with the radially-extending concave portions 111F, a sucking-and-holding force generated by the vacuum holding is directly transmitted to the sucked surface of the silicon water W through the radially-extending concave portions 111F and the through holes 112A. Accordingly, the silicon wafer W is stably sucked and held on the vacuum surface through the vacuum protection pad 112.

Other Embodiment(s)

The invention is not limited to the above-described embodiment, but various improvements and modifications of designs can be applied thereto without deviating from the scope of the invention.

In the above exemplary embodiment, it is described that the first end of each of the radially-extending concave portions 111F near the center O is in communication with the communication hole 111B and the second end thereof is in communication with the annular concave portion 111C. However, all the second sides of the radially-extending concave portions 111E are not necessarily in communication with the annular concave portion 111C.

Although it is described that the annular concave portion 111C is formed on the vacuum surface 111A, an arc-shaped concave portion may be formed in place of the annular concave portion 111C. In this arrangement, the arc-shaped concave portion is preferably formed in an arc along the circumference of the imaginary circle around the center O of the vacuum surface 111A. A single or two or more arc-shaped concave portions may be provided. When a single arc-shaped concave portion is provided, the arc-shaped concave portion is formed substantially in a C-shape, in which an opening of the C-shaped concave portion is formed at any position. When two or more arc-shaped concave portions are provided, preferably, the arc-shaped concave portions have the same length and are formed at an equi-angular distance on the circumference of the imaginary circle. It should be noted that, when a plurality of arc-shaped concave portions are formed, all the arc-shaped concave portions need to be in communication with the radially-extending concave portions 111F so that all the arc-shaped concave portions are vacuumized.

Moreover, a single or two or more concave portions concentrically with the annular concave portion 111C may be provided in the central region 111D of the vacuum chuck stage 111.

Further, although each of the through holes 112A of the vacuum protection pad is shown in a circle in the drawings, the through holes 112A may be formed in any shape as long as the through holes 112A can be in communication with the communication hole 111B and the radially-extending concave portions 111F.

Specific process and structure for implementing the invention may be altered as long as an object of the invention can be achieved.

EXAMPLES

Next, the invention will be described in further detail below with reference to Example and Comparatives. However, it should be understood that the scope of the invention is not limited by the Example and Comparatives.

Example 1

A vacuum chuck stage having a 290-mm diameter, a communication hole at the center, an annular concave portion on a vacuum surface, and eight radially-extending concave portions in a central region located closer to the center than the annular concave portion was used. Moreover, the vacuum chuck stage further has four concave portions concentrically the annular concave portion in the central region.

A vacuum protection pad having a 296-mm diameter and provided by laminating a polyethylene terephthalate-made sheet on a polyurethane resin having a compressibility of 23 to 33% using a double-sided adhesive tape was used. The vacuum protection pad had through holes at positions in communication with the communication hole and the radially-extending concave portions. In other words, no through hole was provided in the outer circumferential region of the vacuum chuck stage in Example 1. The vacuum protection pad was attached to the central region of the vacuum surface through the double-sided adhesive tape. A vacuum chuck of Example 1 was thus formed.

Comparative 1

The same vacuum chuck stage as in Example 1 was prepared.

Figure 12:
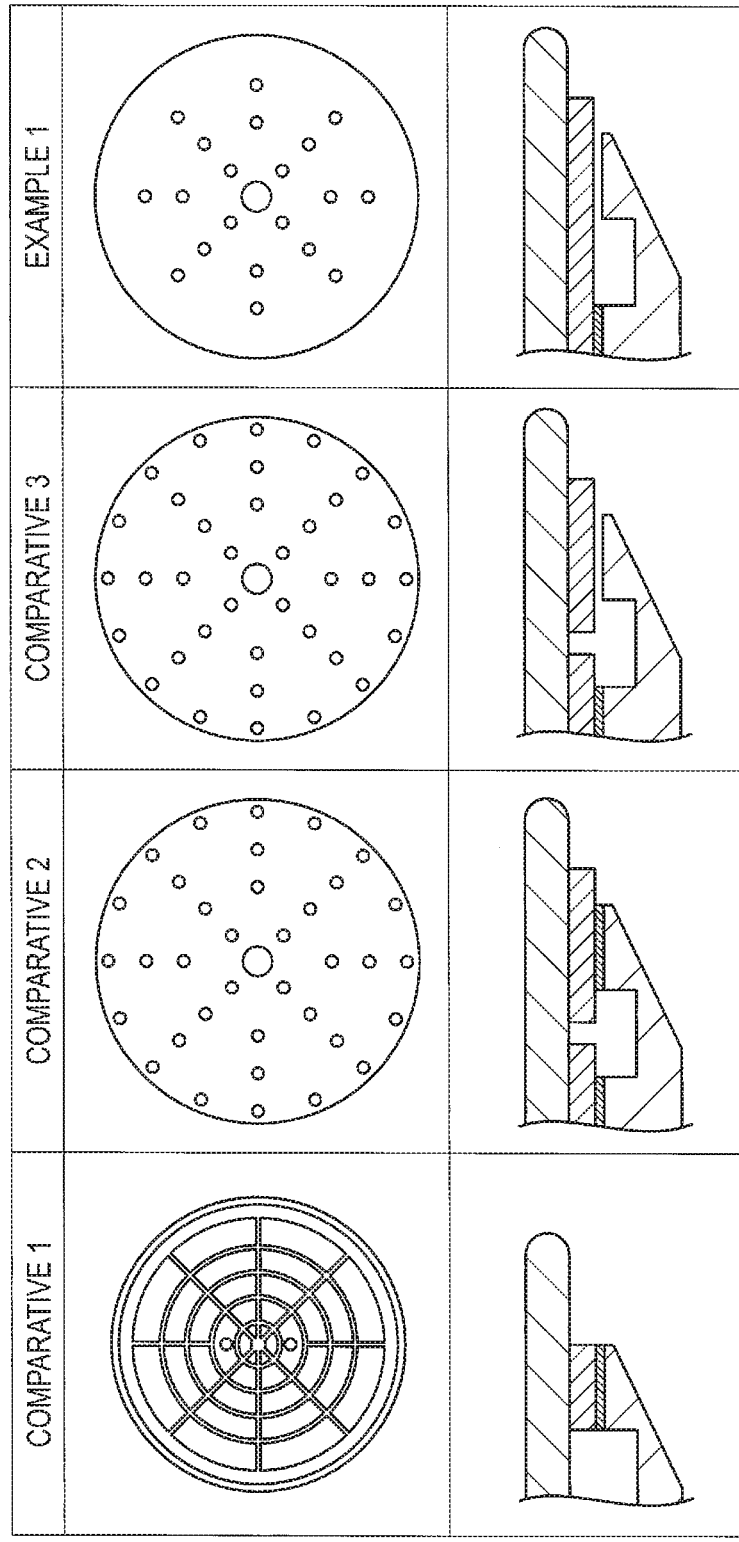
FIG. 12 shows a shape of a vacuum protection pad and a partial cross section of the vacuum chuck sucking and holding the silicon wafer in each of Example 1 and Comparatives 1 to 3.

A vacuum protection pad was prepared in a shape punched in conformity with a pattern of the concave portion of the vacuum chuck stage as shown in FIG. 12. The vacuum protection pad was attached to the vacuum surface of the vacuum chuck stage through the double-sided adhesive tape. A vacuum chuck of Comparative 1 was thus formed.

Comparative 2

The same vacuum chuck stage as in Example 1 was prepared.

The vacuum protection pad having the same shape and formed of the same material as in Example 1 was used. The vacuum protection pad had through holes at positions in communication with the communication hole and the radially-extending concave portions, and in the outer circumferential region. The vacuum protection pad was attached to the entire vacuum surface through the double-sided adhesive tape. In other words, in Comparative 2, the vacuum surface and the vacuum protection pad were bonded to each other not only in the central region but also in the outer circumferential region. A vacuum chuck of Comparative 2 was thus formed.

Comparative 3

The same vacuum chuck stage as in Example 1 was prepared. Moreover, the same vacuum protection pad as in Comparative 2 was prepared. The vacuum protection pad was attached to the central region of the vacuum surface through the double-sided adhesive tape. A vacuum chuck of Comparative 3 was thus formed.

Beveling and Polishing

The silicon wafer W was beveled and polished with the beveling/polishing device provided with the vacuum chuck of Example 1 and Comparatives 1 to 3. The silicon wafer W (i.e., an object to be processed) having a 300-mm diameter and mirror-polished front and rear surfaces was prepared. As the polishing pad, an unwoven fabric (polishing fabric) having a compressibility of 5% or more and a thickness of 1.2 mm or more was used. As the polishing slurry, a KOH aqueous solution having pH of 10 to 11 and including colloidal silica abrasive grains having a 30-nm mean particle size was used.

Evaluation

In Example 1 and Comparatives 1 to 3, LPD (Light Point Defect) present on the sucked surface of the beveled-and-polished silicon wafer W was measured using a wafer surface inspection device (SP2 manufactured by KLA-TENCOR Corporation). The results are shown in FIG. 13.

Figure 13:
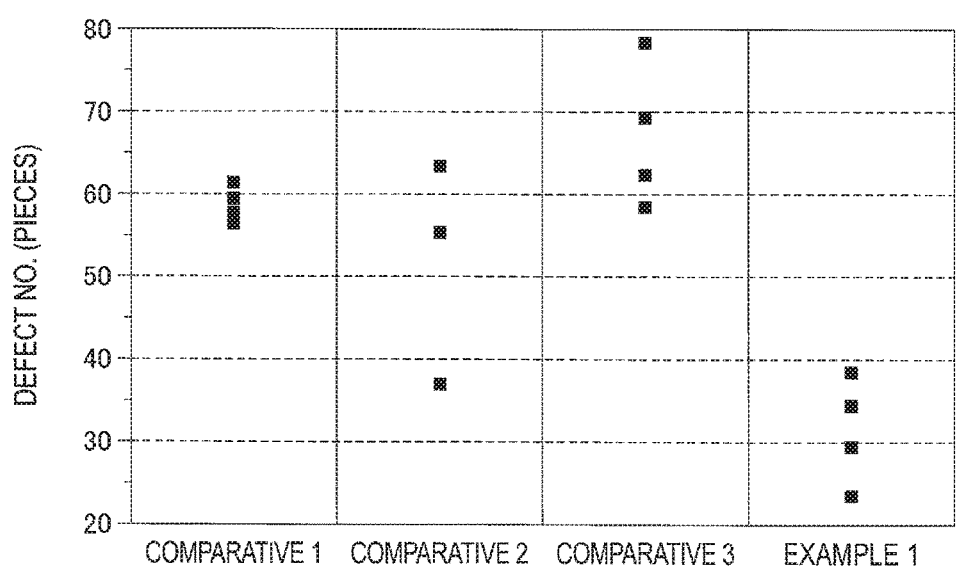
FIG. 13 shows the number of the defects on the sucked surface of the silicon wafer after the beveling and polishing in each of Example 1 and Comparatives 1 to 3.

As apparently shown in FIG. 13, in Comparative 1 with use of the vacuum protection pad having the shape punched in conformity with the pattern of the concave portions of the vacuum chuck stage, about 60 LPDs were generated.

In Comparative 2 with use of the vacuum protection pad having the through holes in the outer circumferential region in addition to those at the positions in communication with the communication hole and the radially-extending concave portions, the vacuum protection pad being attached to the central region and the outer circumferential region of the vacuum surface of the vacuum chuck stage, the number of LPDs fluctuated in a range from 40 to 60.

In Comparative 3 with use of the vacuum protection pad having the through holes in the outer circumferential region in addition to those at the positions in communication with the communication hole and the radially-extending concave portions, the vacuum protection pad being attached only to the central region of the vacuum surface of the vacuum chuck stage, the number of LPDs was aggravated in a range from 80 to 60.

In the above arrangement, at the outermost circumferential region of the vacuum chuck stage, the vacuum holding is disturbed in two systems of one passing through the interface between the silicon wafer and the vacuum protection pad and the other one passing through the interface between the vacuum protection pad and the vacuum chuck stage. Accordingly, it is inferred that the LPDs were generated by lowering the tight contact at the interface between the silicon wafer and the vacuum protection pad to lower the followability of the vacuum protection pad due to the wafer vibration. Consequently, it is inferred that a mechanical action was increasingly locally applied to the outer circumferential region of the silicon wafer by the wafer vibration to further promote defect formation.

On the contrary, in Example 1, the number of LPDs in the outer circumferential region was significantly decreased to a range from 20 to 40 and it was confirmed that generation of the defects in the outer circumferential region of the vacuum chuck was inhibitable using the beveling/polishing device provided with the vacuum chuck of the invention.

The invention claimed is:

1. A vacuum chuck comprising:
   a vacuum chuck stage comprising a circular vacuum surface;
   a vacuum protection pad provided to the vacuum surface;
   an annular or arc-shaped concave portion dividing the vacuum surface into a central region located closer to a center of the vacuum surface and an outer circumferential region located on an outer circumferential side; and
   radially-extending concave portions formed in the central region, wherein
   the vacuum protection pad has through holes in communication with the radially-extending concave portions, and
   the vacuum protection pad is bonded to the vacuum surface at the central region excluding the radially-extending concave portions and is unbonded to the vacuum surface in the outer circumferential region.

2. The vacuum chuck according to claim 1, wherein the vacuum protection pad is shaped in a circle having a diameter equal to or more than a diameter of the vacuum surface.

3. A beveling-and-polishing device comprising the vacuum chuck according to claim 1.

4. The vacuum chuck according to claim 1, wherein an entirety of the radially extending concave portions are formed in the central region.

5. A method of beveling and polishing a silicon wafer using a vacuum chuck, the vacuum chuck comprising: a vacuum chuck stage comprising a circular vacuum surface; and a vacuum protection pad provided to the vacuum surface, the method comprising:
   sucking and holding the silicon wafer with the vacuum protection pad; and
   polishing a beveled portion of the silicon wafer,
   the vacuum chuck further comprising:
      an annular or arc-shaped concave portion dividing the vacuum surface into a central region located closer to a center of the vacuum surface and an outer circumferential region located on an outer circumferential side; and
      radially-extending concave portions formed in the central region, wherein
   the vacuum protection pad has through holes in communication with the radially-extending concave portions, and
   the vacuum protection pad is bonded to the vacuum surface at the central region excluding the radially-extending concave portions and is unbonded to the vacuum surface in the outer circumferential region.

6. The method of beveling and polishing the silicon wafer according to claim 5, wherein
   the vacuum protection pad is shaped in a circle having a diameter equal to or more than a diameter of the vacuum surface.

7. The method of beveling and polishing the silicon wafer according to claim 5, wherein an entirety of the radially extending concave portions are formed in the central region.

* * * * *